(12) United States Patent
Tamura

(10) Patent No.: US 8,304,767 B2
(45) Date of Patent: Nov. 6, 2012

(54) SEMICONDUCTOR DEVICE AND PRODUCTION METHOD THEREOF

(75) Inventor: Masahiro Tamura, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 186 days.

(21) Appl. No.: 12/727,087

(22) Filed: Mar. 18, 2010

(65) Prior Publication Data

US 2010/0264416 A1    Oct. 21, 2010

(30) Foreign Application Priority Data

Apr. 16, 2009    (JP) .................................. 2009-099942

(51) Int. Cl.
*H01L 21/336* (2006.01)
*H01L 29/786* (2006.01)

(52) U.S. Cl. .................. 257/57; 257/151; 257/E21.412; 257/E29.289

(58) Field of Classification Search .................... 257/57, 257/151, E21.412, E29.289
See application file for complete search history.

(56) References Cited

U.S. PATENT DOCUMENTS

2008/0283842 A1* 11/2008 Hayashi et al. ................. 257/72

FOREIGN PATENT DOCUMENTS

JP    2001-77372 A    3/2001

* cited by examiner

*Primary Examiner* — Lynne Gurley
*Assistant Examiner* — Vernon P Webb
(74) *Attorney, Agent, or Firm* — Fitzpatrick, Cella, Harper & Scinto

(57) ABSTRACT

Provided is a crystalline silicon thin film semiconductor device which is capable of reducing off-state leakage current and has excellent current rising characteristics. The thin film transistor includes a semiconductor layer formed of an amorphous silicon layer and a crystalline silicon layer. A drain electrode is provided in direct contact with the crystalline silicon layer of the semiconductor layer, to thereby improve the current rising characteristics.

9 Claims, 3 Drawing Sheets

SEMICONDUCTOR DEVICE AND PRODUCTION METHOD THEREOF

BACKGROUND OF THE INVENTION

1. Field of the Invention

The present invention relates to a semiconductor device which utilizes a crystalline silicon layer as an active layer, and a production method thereof.

2. Description of the Related Art

There is conventionally known an active matrix type display device, which utilizes thin film semiconductors to drive pixels. A typical example of the thin film semiconductor utilized in such a display device includes a thin film silicon semiconductor. The thin film silicon semiconductor is roughly divided into the one formed of an amorphous silicon film and the other formed of a crystalline silicon film.

A thin film transistor which utilizes a crystalline silicon layer as an active layer (crystalline silicon TFT) is larger in mobility than a thin film transistor which utilizes an amorphous silicon layer as an active layer (amorphous silicon TFT), and hence the crystalline silicon TFT has characteristics of high driving performance superior to the amorphous silicon TFT. In addition, as compared with the amorphous silicon TFT, the crystalline silicon TFT has high current stress resistance, and hence has an advantage that a threshold voltage Vth is less shifted after long time driving. Furthermore, of the crystalline silicon TFTs, reduced production cost may be achieved in a crystalline silicon TFT including an active layer which may be formed without the need for a laser annealing process or ion doping process for crystallization, as compared with a case of including an active layer of low-temperature polycrystalline silicon. Still further, such crystalline silicon TFT does not suffer from a variation in crystallinity caused by the laser annealing process, and hence has another advantage of being formed over a large area with ease.

However, the crystalline silicon TFT suffers from a problem of increased off-state leakage current, and hence various measures against the problem have been provided.

Japanese Patent Application Laid-Open No. 2001-077372 proposes a top-gate staggered TFT having a stacked structure of an amorphous silicon layer and a polycrystalline silicon layer formed on the amorphous silicon layer, which serve as a semiconductor layer on source and drain electrodes. The amorphous silicon layer is formed on n$^+$ Si layers of the source electrode and the drain electrode, and positioned at an interface of a channel on an opposite side thereof. As proposed in Japanese Patent Application Laid-Open No. 2001-077372, the amorphous silicon layer, which has a wide band gap, is deposited on the n$^+$ Si layers at a prescribed film thickness or more, to thereby reduce off-state leakage current flowing through a back channel of an active layer.

However, in the structure proposed in Japanese Patent Application Laid-Open No. 2001-077372, a heterojunction is formed between the active layer having a narrow band gap and the amorphous silicon layer having a wide band gap. When electrons flow into the drain electrode, a potential barrier formed at the heterojunction portion hinders the electrons from flowing in a reverse direction from the active layer into the amorphous silicon layer. If an electric field between the source and the drain is small, electrons are less likely to flow therebetween due to the barrier, which arises a problem that current rising characteristics are deteriorated.

In order to exhibit the characteristics inherent in the crystalline silicon semiconductor device sufficiently enough to be put into practical use, off-state leakage current needs to be suppressed without deteriorating the rising characteristics of current between the source electrode and the drain electrode.

SUMMARY OF THE INVENTION

The present invention has been made in view of the problem described above, and therefore it is an object of the present invention to provide a crystalline silicon semiconductor device which sufficiently exhibits superior characteristics inherent in the crystalline silicon semiconductor device so as to be superior in current rising characteristics and off-state leakage current characteristics, and a production method of the crystalline silicon semiconductor device.

The above-mentioned object of the present invention is achieved by a thin film transistor including: a semiconductor layer including an amorphous silicon layer and a crystalline silicon layer which are stacked on a substrate; a source electrode and a drain electrode which are formed in contact with the semiconductor layer and spaced apart from each other; and a gate electrode formed on a side of the crystalline silicon layer with a gate insulating layer being interposed between the gate electrode and the crystalline silicon layer, for controlling current flowing between the source electrode and the drain electrode, in which the source electrode is formed in direct contact with the amorphous silicon layer, and the drain electrode is formed in direct contact with the crystalline silicon layer.

According to the thin film transistor described in the present invention, when electrons as carriers flow from the source electrode into the drain electrode, at a heterojunction portion between the crystalline silicon layer and the amorphous silicon layer, the electrons always flow in a forward direction from the amorphous silicon layer having a wide band gap into the crystalline silicon layer having a narrow band gap. Therefore, the current rising characteristics are not deteriorated. In addition, the amorphous silicon layer having a wide band gap is formed on a side of a back channel of an active layer, which serves as a path for off-state leakage current, and hence off-state leakage current may be suppressed.

Further features of the present invention will become apparent from the following description of exemplary embodiments with reference to the attached drawings.

DESCRIPTION OF THE EMBODIMENTS

Preferred embodiments of the present invention will now be described in detail with reference to the accompanying drawings.

First Embodiment

Figure 1A:
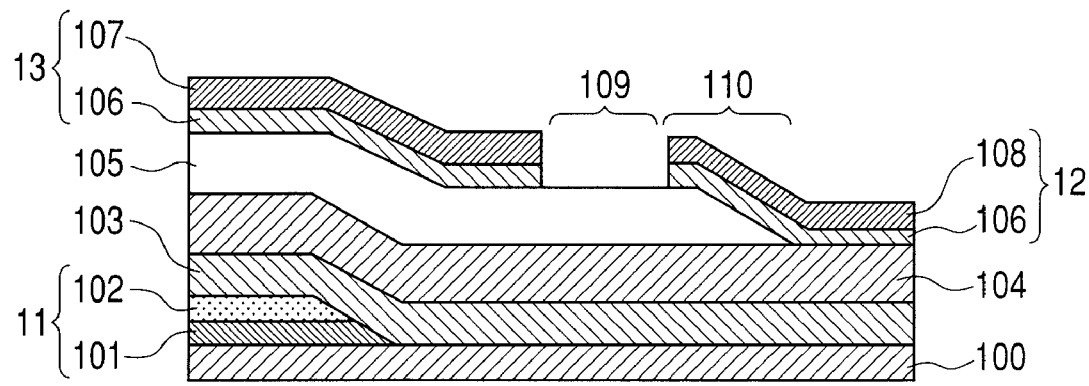
FIGS. 1A and 1B are views schematically illustrating a semiconductor device according to a first embodiment of the present invention.
Figure 1B:
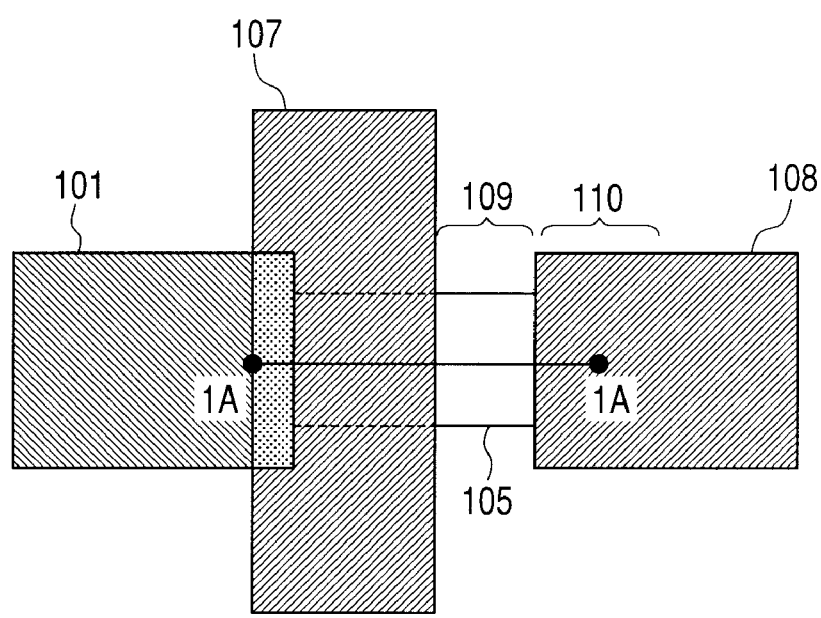

FIGS. 1A and 1B each illustrate a schematic view of a representative example of a semiconductor device according to a first embodiment of the present invention. FIG. 1B is a plan view and FIG. 1A is a cross-sectional view taken along the line 1A-1A of FIG. 1B.

Referring to FIG. 1A, the semiconductor device includes a substrate 100 made of high-melting glass, quartz, or ceramics, and a source electrode 11. The source electrode 11 is formed of a source electrode layer 101 formed on the substrate 100, and an ohmic contact layer 102. The semiconductor device further includes a semiconductor layer formed of an amorphous silicon layer 103 and a crystalline silicon layer 104 which becomes an active layer.

In the semiconductor device according to the present invention, of possible structures of silicon, silicon is defined as crystalline silicon, which has a Raman spectrum in Raman spectroscopy whose peak appears around a Raman shift of 520 cm$^{-1}$ and in particular has a volume fraction of crystals of 20% or more.

The Raman shift of 520 cm$^{-1}$ refers to a Raman shift at which a peak of the Raman spectrum corresponding to phonon energy inherent in silicon appears in the case of silicon having a typical crystal component.

The volume fraction refers to a relative volume ratio of crystalline silicon in a thin film, which is determined using values obtained by subjecting a spectrum in Raman spectroscopy to waveform separation into a waveform having a peak resulting from crystalline silicon and a waveform having a peak resulting from amorphous silicon, and integrating the waveforms.

In terms of short range order, an amorphous silicon layer has a region having the same structure as that in a crystalline silicon layer as well. In view of this, in the present invention, as long as silicon has a volume fraction of crystals of less than 20%, silicon is defined as amorphous silicon even if a peak appears around the Raman shift of 520 cm$^{-1}$. In addition, silicon having no peak appearing around 520 cm$^{-1}$ is also defined as amorphous silicon.

The semiconductor device further includes a gate insulating layer 105, an ohmic contact layer 106, a gate electrode layer 107, and a drain electrode layer 108. A drain electrode 12 is formed of the drain electrode layer 108 and the ohmic contact layer 106. As illustrated in FIG. 1A, the drain electrode 12 and the crystalline silicon layer 104 are formed in direct contact with each other. This structure allows electrons to migrate from the crystalline silicon layer to the drain electrode with no amorphous silicon layer being formed therebetween, and hence a potential barrier at a heterojunction portion does not hinder the electron migration. Therefore, current rising characteristics may be improved.

In FIG. 1A, the ohmic contact layer 106 is formed between the gate electrode layer 107 and the gate insulating layer 105. In this embodiment, a gate electrode 13 is formed of the gate electrode layer 107 and the ohmic contact layer 106. The ohmic contact layer 106 formed under the gate electrode layer 107 may be eliminated.

As illustrated in FIG. 1A, the gate electrode is formed to overlap the source electrode so that no offset region may be formed between the source and gate electrodes. Therefore, a reduced resistance may be achieved at the time of rising after the application of voltage to the gate electrode.

The drain electrode 12 is formed on the crystalline silicon layer 104 in a region in which the gate insulating layer 105 is not formed. In this case, as illustrated in FIG. 1A, the drain electrode 12 may be formed in partial contact with the top surface or end portion of the gate insulating layer 105 so as to overlap the gate insulating layer 105 to form an electrode covering region 110. This structure allows an electric field applied to the drain electrode to cause the active layer formed below the electrode covering region 110, which is overlapped with the drain electrode, to be weakly inverted so that off-state leakage current due to an electric field concentration to a drain electrode end may be reduced. As a result, a tunnel effect, which may cause the off-state leakage current, may be suppressed.

Next, a production method of a thin film transistor (TFT) having the structure described above is described with reference to FIGS. 2A to 2E.

First, on the substrate 100, the source electrode layer 101 made of Mo, Ti, W, Ni, Ta, Cu, Cr, or Al, or an alloy or stacked structure thereof is deposited at 10 to 300 nm by sputtering, vacuum vapor deposition, or the like.

Furthermore, on the source electrode layer 101, the ohmic contact layer 102 is formed by plasma chemical vapor deposition (CVD). Considering the need to reduce a contact resistance between the ohmic contact layer 102 and the amorphous silicon layer 103 to be formed subsequently, the ohmic contact layer 102 is desired to be an amorphous n$^+$ Si layer (n-type silicon layer) which is formed under the same condition as that for the amorphous silicon layer 103.

Figure 2A:
FIGS. 2A, 2B, 2C, 2D and 2E are views for illustrating a production method for the semiconductor device according to the first embodiment of the present invention.

A thickness of the ohmic contact layer 102 is generally 10 to 300 nm, desirably 20 to 100 nm. Then, after a pattern is formed using a resist on the ohmic contact layer 102, dry etching and wet etching are performed in a combination manner or one of dry etching and wet etching is performed so that the source electrode 11 may be formed as illustrated in FIG. 2A.

Figure 2B:

Subsequently, by plasma CVD, the amorphous silicon layer 103 is formed as illustrated in FIG. 2B. Note that a thickness of the amorphous silicon layer 103 is generally 50 to 300 nm, desirably 100 to 200 nm.

Film formation conditions for the amorphous silicon layer 103 are relatively low power density, high reactant pressure, and low hydrogen dilution, as compared with the case of forming the crystalline silicon layer. The RF power density is generally 0.01 to 1 W/cm$^2$, desirably 0.01 to 0.3 W/cm$^2$. The reactant pressure is generally 0.5 to 5 torr, desirably 0.7 to 2 torr. Furthermore, examples of a raw material gas for use include SiH$_4$, Si$_2$H$_6$, SiH$_2$, Cl$_2$, SiF$_4$, SiH$_2$, and F$_2$, and examples of a dilution gas for use include H$_2$ and an inert gas. Note that a dilution ratio of H$_2$ to the silicon raw material gas is generally 0 to 20 times, desirably 0 to 15 times.

In addition, boron may be mixed in the amorphous silicon layer 103 as a dopant, and applicable examples of a dopant gas include BF$_3$, B$_2$, and H$_6$. Note that a dose thereof is generally 1×10$^{-19}$ atm/cm$^3$ or less, desirably 1×10$^{-17}$ to 2×10$^{-18}$ atm/cm$^3$. The doping of boron is employed to control electric characteristics of the amorphous silicon layer 103. At this time, in order to induce growth and nucleation in the crystalline silicon layer 104, which is to be formed subsequently, plasma processing may be performed using a gas containing a halogen element after the film formation of the amorphous silicon layer 103.

Figure 2C:
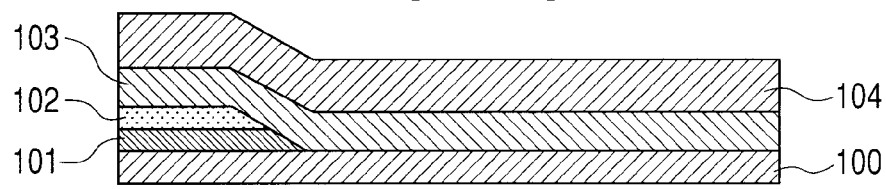

Subsequently, as illustrated in FIG. 2C, the crystalline silicon layer 104 is formed by plasma CVD. Note that a thickness of the crystalline silicon layer 104 is generally 20 to 200 nm, desirably 40 to 100 nm.

The crystalline silicon layer 104, which is to become an active layer, is formed on the amorphous silicon layer 103 and desired to be allowed to continuously grow with crystal grains existing in the top surface of the amorphous silicon layer 103 being acting as seeds. Enhanced crystallinity of the active layer may improve a current ON/OFF ratio.

As to film formation conditions for the crystalline silicon layer 104, the RF power density is generally 0.05 to 1 W/cm$^2$, desirably 0.1 to 0.8 W/cm$^2$, and the reactant pressure is generally 1.0 to 10 torr, desirably 1.5 to 8 torr. Furthermore, examples of a raw material gas for use include $SiH_4$, $Si_2H_6$, $SiH_2$, $Cl_2$, $SiF_4$, $SiH_2$, and $F_2$, and examples of a dilution gas for use include $H_2$ and an inert gas. Note that a dilution ratio of $H_2$ to the silicon raw material gas is generally 100 to 2,000 times. A preferable value of the dilution ratio differs depending on whether the silicon raw material gas contains a halogen element or not.

In order to further enhance the crystallinity of the crystalline silicon layer 104, the crystalline silicon layer 104 may be deposited with a method in which the step of depositing the crystalline silicon layer and the step of performing hydrogen plasma irradiation are repeatedly performed alternately. This method may be achieved through appropriate adjustment to a mass flow controller for the film formation gases. The time allotment of the deposition step and the hydrogen plasma irradiation step is appropriately adjusted under the confirmation of a deposition rate and a crystallization rate.

Subsequently, a pattern is formed using a resist on the semiconductor layer obtained after the formation of the crystalline silicon layer 104. After that, dry etching and wet etching are performed in a combination manner or one of dry etching and wet etching is performed so that the semiconductor layer, which is formed of the amorphous silicon layer 103 and the crystalline silicon layer 104, may be isolated in an island shape.

Figure 2D:
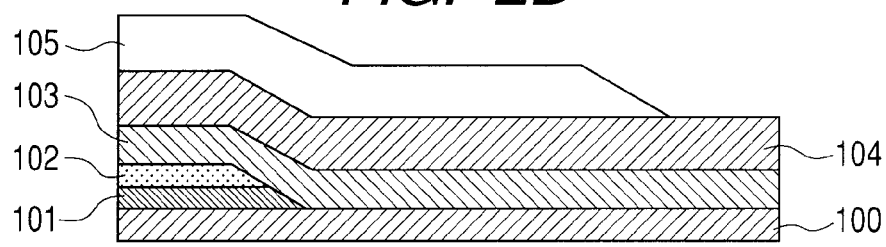
Figure 2E:
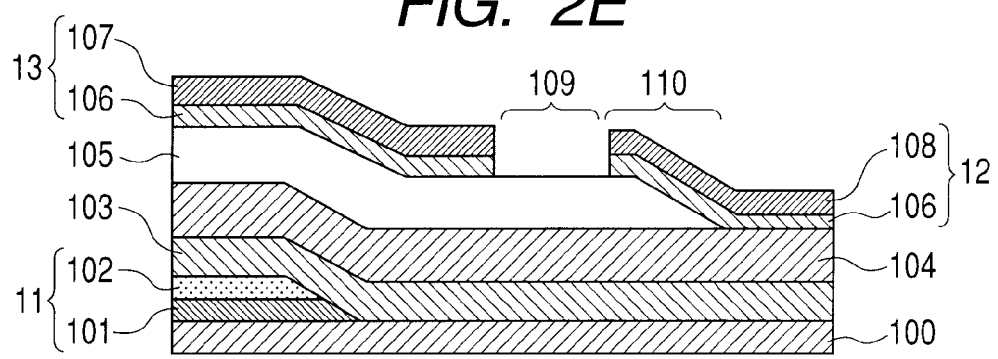

Subsequently, as illustrated in FIG. 2D, the gate insulating layer 105 is formed by plasma CVD.

Note that a thickness of the gate insulating layer 105 is 50 to 300 nm. Examples of the gate insulating layer 105 for use include an $SiO_2$ layer and an SiN layer. The $SiO_2$ layer or the SiN layer is stacked by plasma CVD using a gas mixture of tetraethyl orthosilicate (TEOS) and $O_2$ or a gas mixture of $SiH_4$, $NH_3$, and $N_2$.

The gate insulating layer 105 may be formed so as to have a two-layer stacked structure of a first gate insulating layer and a second gate insulating layer. In this case, after the crystalline silicon layer 104 is formed as illustrated in FIG. 2C, the first gate insulating layer (not shown) is formed subsequently. A thickness of the first gate insulating layer is 30 to 200 nm. After the formation of the first gate insulating layer (not shown), a pattern is formed using a resist to perform isolation. Subsequently, the second gate insulating layer (not shown) is formed on the first gate insulating layer on which the pattern is formed. A thickness of the second gate insulating layer is 100 to 300 nm. The semiconductor obtained after the formation of the second gate insulating layer has the same structure as illustrated in FIG. 2D.

Subsequently, a pattern is formed using a resist on the gate insulating layer 105, and dry etching and wet etching are performed in a combination manner or one of dry etching and wet etching is performed so as to provide a portion in which the drain electrode is to be formed in contact with the crystalline silicon layer 104.

Subsequently, the ohmic contact layer 106 is formed. Considering the need to reduce a contact resistance between the drain electrode and the crystalline silicon layer, the ohmic contact layer 106 is desired to be an n-type crystalline silicon layer which is formed under the same condition as that for the crystalline silicon layer 104.

Similarly to the ohmic contact layer 102, the ohmic contact layer 106 is formed by plasma CVD, and a thickness thereof is generally 10 to 300 nm, desirably 20 to 100 nm.

The gate electrode 13 and the drain electrode 12 may be formed simultaneously. The gate electrode layer 107 and the drain electrode layer 108 are each formed by an Mo, Ti, W, Ni, Ta, Cu, Cr, or Al film, or a laminated film thereof having a thickness of 100 to 600 nm. After a pattern is formed using a resist, dry etching and wet etching are performed in a combination manner or one of dry etching and wet etching is performed so that the gate electrode and the drain electrode may be formed.

An offset region 109 formed between the gate electrode and the drain electrode may be determined depending only on a resolution of exposure. As compared with a general offset when a gate electrode and a drain electrode are formed as different layers, the offset in this embodiment may be set smaller with more accuracy and adjusted to an appropriate value so as to improve a current ON/OFF ratio. In addition, the electrode covering region 110 may be appropriately determined through adjustment.

The processes described above are completed as illustrated in FIG. 2E. Note that each of the exemplary embodiments of the present invention is not limited to the thin film transistor illustrated in FIGS. 1A and 1B and FIGS. 2A to 2E.

Next, a production example of the thin film transistor according to this embodiment is described.

By sputtering, an Mo layer of 50 nm was deposited as the source electrode layer 101, and subsequently an n-type amorphous silicon layer was deposited at 50 nm as the ohmic contact layer 102 by plasma CVD. After that, by photolithography and dry etching, the source electrode was formed.

Subsequently, the amorphous silicon layer 103 of 200 nm was deposited by plasma CVD. Film formation conditions for this amorphous silicon layer were as follows.
(Film Formation Conditions)
Substrate size: 300×400 mm
Substrate temperature: 300° C.
RF power: 0.05 W/cm$^2$
Pressure: 1.5 torr
$SiH_4$: 250 sccm
$H_2$: 2,000 sccm Furthermore, continuous film formation was performed so that the crystalline silicon layer 104 was deposited on the amorphous silicon layer 103 by plasma CVD. In this process, the deposition step for the crystalline silicon layer and the hydrogen plasma irradiation step were repeatedly performed alternately. Respective conditions for the steps were as follows.
(Film Formation Conditions)
Substrate temperature: 200° C.
RF power: 0.18 W/cm$^2$
Pressure: 2.0 torr
Film thickness: 50 nm
(Deposition Step)
$SiH_4$: 20 sccm
$H_2$: 2,000 sccm
(Hydrogen Plasma Irradiation Step)
$SiH_4$: 0 sccm
$H_2$: 2,000 sccm
(Step Cycle)
Deposition/Hydrogen Plasma Irradiation: 10 Cycles Furthermore, the above-mentioned amorphous silicon layer 103 and crystalline silicon layer 104 were each formed in an island shape by photolithography and dry etching.

Subsequently, on the crystalline silicon layer 104, an $SiN_X$ film was deposited at 200 nm as the gate insulating layer 105 by plasma CVD. Then, after patterning was performed by dry etching, an n-type crystalline silicon layer was deposited at 50 nm as the ohmic contact layer 106 by plasma CVD.

Finally, a metal layer formed of an Mo layer of 50 nm and an Al layer of 500 nm was deposited, and then wet etching and dry etching were performed so that the gate electrode 13 and the drain electrode 12 were formed. Each length of the offset region 109 and the electrode covering region 110 was 1 μm in the sheet direction of FIG. 1A.

When electric characteristics of the thin film transistor thus produced were measured, such excellent transistor characteristics as to have a current ON/OFF ratio of 5 digits or more were obtained.

Figure 3:
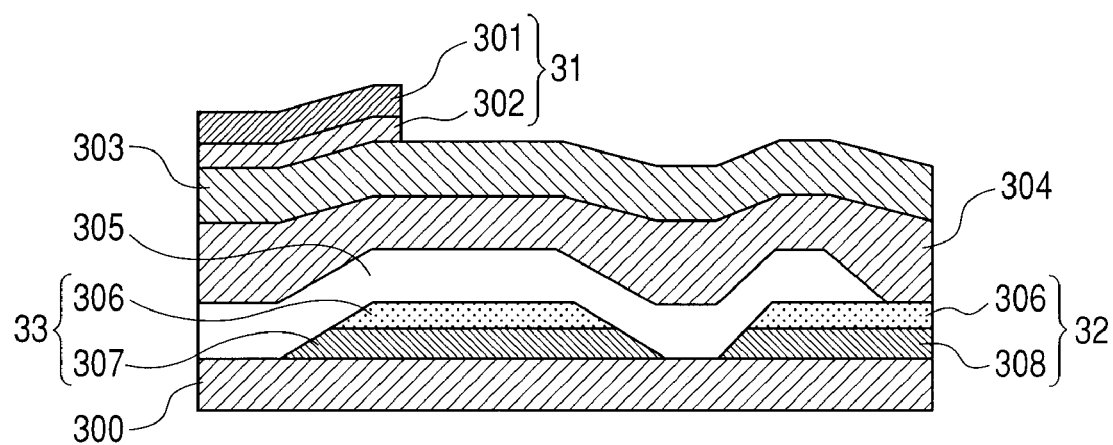
FIG. 3 is a view schematically illustrating a modification example of the semiconductor device according to the first embodiment of the present invention.

The case of the top-gate transistor has been described above, but the present invention is also applicable to a bottom-gate transistor as illustrated in FIG. 3.

The semiconductor device of FIG. 3 includes a substrate 300, a gate electrode layer 307 and a drain electrode layer 308 which are formed on the substrate 300, and an ohmic contact layer 306. A gate electrode 33 is formed of the gate electrode layer 307 and the ohmic contact layer 306, and a drain electrode 32 is formed of the drain electrode layer 308 and the ohmic contact layer 306. The semiconductor device further includes a gate insulating layer 305 and a semiconductor layer formed of an amorphous silicon layer 303 and a crystalline silicon layer 304 which is to become an active layer. The drain electrode 32 and the crystalline silicon layer 304 are formed in direct contact with each other.

A source electrode 31 is formed of a source electrode layer 301 and an ohmic contact layer 302. The source electrode 31 is formed in direct contact with the amorphous silicon layer 303. As in the top-gate transistor of FIGS. 1A and 1B described above, the source electrode may be formed to overlap the gate electrode.

Furthermore, the gate insulating layer 305 may be formed in partial contact with the top surface or end portion of the drain electrode 32 so as to overlap the drain electrode 32 to form an electrode covering region.

As to a production method of the bottom-gate transistor, the one for the top-gate transistor described above is basically applicable. First, the gate electrode layer 307 and the drain electrode layer 308 are deposited on the substrate 300, and the ohmic contact layer 306 is stacked on the gate electrode layer 307 and the drain electrode layer 308. Then, etching is performed so that the gate electrode 33 and the drain electrode 32 may be formed.

Next, the gate insulating layer 305 is formed over the substrate thus obtained. After a pattern is formed using a resist, etching is performed so as to partially remove an upper portion of the drain electrode 32. After that, the crystalline silicon layer 304 and the amorphous silicon layer 303, which are the semiconductor layer, are stacked over the substrate thus obtained, and isolated in an island shape.

Finally, etching is performed so as to form the source electrode 31, which is formed on the amorphous silicon layer 303 and formed of the ohmic contact layer 302 and the source electrode layer 301.

Second Embodiment

Figure 4:
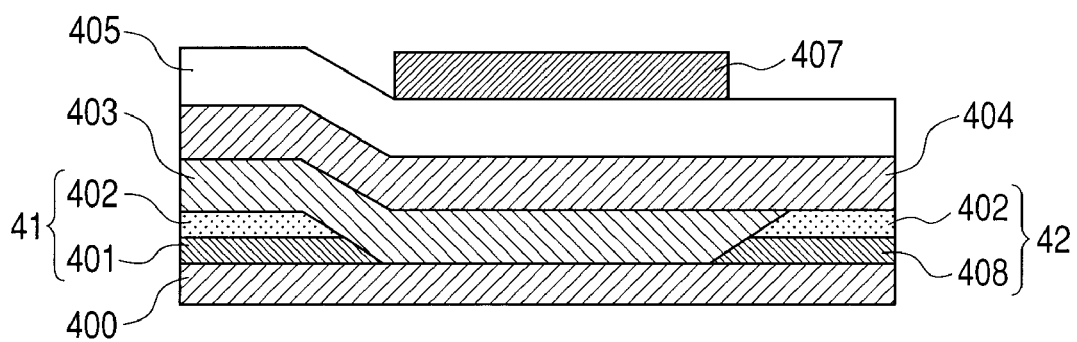
FIG. 4 is a view schematically illustrating a semiconductor device according to a second embodiment of the present invention.

FIG. 4 illustrates a schematic view of a representative example of a semiconductor device according to a second embodiment of the present invention. A difference from the first embodiment resides in that a drain electrode layer 408 is formed on a substrate similarly to a source electrode layer 401.

In this embodiment, the source electrode layer 401 and the drain electrode layer 408 are formed on a substrate 400, and an ohmic contact layer 402 is formed on each of the source electrode layer 401 and the drain electrode layer 408. As in the first embodiment, a semiconductor layer is formed of an amorphous silicon layer 403 and a crystalline silicon layer 404 which is to become an active layer.

As in the first embodiment, the semiconductor device has a structure in which a source electrode 41 formed of the source electrode layer 401 and the ohmic contact layer 402 is formed in direct contact with the amorphous silicon layer 403 while a drain electrode 42 formed of the drain electrode layer 408 and the ohmic contact layer 402 is formed in direct contact with the crystalline silicon layer 404.

The semiconductor device further includes a gate insulating layer 405 and a gate electrode 407. The gate insulating layer 405 is formed on the crystalline silicon layer 404. As illustrated in FIGS. 1A and 1B of the first embodiment, the gate electrode may be formed to overlap the source electrode.

Next, a production method of a thin film transistor (TFT) having the structure described above is described.

First, on the substrate 400 made of high-melting glass, quartz, or ceramics, as in the first embodiment, the source electrode layer 401 and the drain electrode layer 408 are each deposited at 10 to 300 nm.

Furthermore, on the source electrode layer 401 and the drain electrode layer 408, an n-type amorphous silicon layer ($n^+$ Si layer) is formed as the ohmic contact layer 402 by plasma CVD. A thickness of the ohmic contact layer 402 is generally 10 to 300 nm, desirably 20 to 100 nm. Then, after a pattern is formed using a resist on the ohmic contact layer 402, dry etching and wet etching are performed in a combination manner or one of dry etching and wet etching is performed so that the source electrode and the drain electrode may be formed.

Subsequently, as in the first embodiment, the amorphous silicon layer 403 is formed by plasma CVD. Note that a thickness of the amorphous silicon layer 403 is generally 50 to 300 nm, desirably 100 to 200 nm.

By photolithography and dry etching, patterning is performed on the amorphous silicon layer 403 so that no amorphous silicon layer may remain partially or entirely on an upper portion of the drain electrode 42.

Subsequently, the crystalline silicon layer 404 is formed by plasma CVD. Note that a thickness of the crystalline silicon layer 404 is generally 20 to 200 nm, desirably 40 to 100 nm.

The crystalline silicon layer 404, which is to become an active layer, is desired to be allowed to grow with crystal grains existing in the top surface of the amorphous silicon layer 403 being acting as seeds.

Subsequently, a pattern is formed using a resist on the semiconductor layer obtained after the formation of the crystalline silicon layer 404. After that, dry etching and wet etching are performed in a combination manner or one of dry etching and wet etching is performed so that the semiconductor layer, which is formed of the amorphous silicon layer 403 and the crystalline silicon layer 404, may be isolated in an island shape.

Finally, after the gate insulating layer 405 is formed by plasma CVD, the gate electrode 407 is formed to have a thickness of 100 to 600 nm. Specifically, an electrode material layer is formed on the gate insulating layer 405, and after a pattern is formed using a resist, dry etching and wet etching are performed in a combination manner or one of dry etching and wet etching is performed so that the gate electrode 407 may be formed.

A production example of the thin film transistor according to this embodiment is described.

First, by sputtering, an Mo layer of 50 nm was deposited on the substrate as the source electrode layer 401 and the drain electrode layer 408. Subsequently, the ohmic contact layer 402 was deposited at 50 nm by plasma CVD. After that, by photolithography and dry etching, the source electrode and the drain electrode were patterned and formed.

Subsequently, the amorphous silicon layer 403 of 200 nm was deposited by plasma CVD. Film formation conditions for this amorphous silicon layer were as follows.
(Film Formation Conditions)
Substrate size: 300×400 mm
Substrate temperature: 300° C.
RF power: 0.05 W/cm$^2$
Pressure: 1.5 torr
$SiH_4$: 250 sccm
$H_2$: 2,000 sccm Subsequently, the above-mentioned amorphous silicon layer 403 was patterned by photolithography and dry etching.

Furthermore, on the amorphous silicon layer 403, the crystalline silicon layer 404 was deposited by plasma CVD. In this process, the deposition step for the crystalline silicon layer and the hydrogen plasma irradiation step were repeatedly performed alternately. Respective conditions for the steps were as follows.
(Film Formation Conditions)
Substrate temperature: 200° C.
RF power: 0.18 W/cm$^2$
Pressure: 2.0 torr
Film thickness: 50 nm
(Deposition Step)
$SiH_4$: 20 sccm
$H_2$: 2,000 sccm
(Hydrogen Plasma Irradiation Step)
$SiH_4$: 0 sccm
$H_2$: 2,000 sccm
(Step Cycle)
Deposition/Hydrogen Plasma Irradiation: 10 Cycles Furthermore, the above-mentioned amorphous silicon layer 403 and crystalline silicon layer 404 were each formed in an island shape by photolithography and dry etching.

Subsequently, on the crystalline silicon layer 404 having the island shape, an $SiN_X$ film was deposited at 200 nm as the gate insulating layer 405 by plasma CVD. Then, after patterning was performed by dry etching, a metal layer formed of an Mo layer of 50 nm and an Al layer of 500 nm was deposited, and then wet etching or dry etching was performed so that the gate electrode 407 was formed.

When electric characteristics of the thin film transistor thus produced were measured, such excellent transistor characteristics as to have a current ON/OFF ratio of 5 digits or more were obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-099942, filed Apr. 16, 2009, which is hereby incorporated by reference herein in its entirety.

What is claimed is:

1. A thin film transistor, comprising:
   an active layer including an amorphous silicon layer and a crystalline silicon layer which are stacked on a substrate;
   a source electrode and a drain electrode which are provided in contact with the active layer and apart from each other; and
   a gate electrode provided on the crystalline silicon layer side with a gate insulating layer being interposed between the gate electrode and the crystalline silicon layer, for controlling current flowing between the source electrode and the drain electrode,
   wherein the source electrode is in direct contact with the amorphous silicon layer and is not in direct contact with the crystalline silicon layer, and the drain electrode is in direct contact with the crystalline silicon layer and is not in direct contact with the amorphous silicon layer.

2. The thin film transistor according to claim 1,
   wherein the active layer is stacked such that the amorphous silicon layer is located on the substrate side,
   wherein the source electrode is provided between the substrate and the amorphous silicon layer, and
   wherein the drain electrode is provided on the crystalline silicon layer.

3. The thin film transistor according to claim 1,
   wherein the active layer is stacked such that the crystalline silicon layer is located on the substrate side,
   wherein the drain electrode and the gate electrode are provided between the substrate and the crystalline silicon layer, and
   wherein the source electrode is provided on the amorphous silicon layer.

4. The thin film transistor according to claim 1,
   wherein the gate insulating layer is formed at a part of the region which is in contact with the crystalline silicon layer, and
   wherein the drain electrode is provided in the region which is in contact with the crystalline silicon layer where the gate insulating layer is not formed.

5. The thin film transistor according to claim 4,
   wherein a part of the drain electrode is in contact with the crystalline silicon layer with the gate insulating layer being interposed therebetween, and
   wherein the drain electrode is provided apart from the gate electrode.

6. The thin film transistor according to claim 1,
   wherein the source electrode and the drain electrode are provided between the substrate and the active layer,
   wherein the amorphous silicon layer is provided on the drain electrode excluding at least a part thereof and on the source electrode and the substrate, and
   wherein the crystalline silicon layer is formed on the amorphous silicon layer and on the drain electrode where the amorphous silicon layer is not formed.

7. A method of producing a thin film transistor, comprising:
   forming a source electrode in a partial region of a substrate;
   stacking, on the substrate and the source electrode, an amorphous silicon layer and a crystalline silicon layer sequentially, such that the source electrode is in direct contact with the amorphous silicon layer and is not in direct contact with the crystalline silicon layer;
   forming a gate insulating layer on the crystalline silicon layer in a region excluding a portion spaced apart from the source electrode in a direction along a surface of the substrate;
   forming a gate electrode on the gate insulating layer; and
   forming a drain electrode on the crystalline silicon layer in a region where the gate insulating layer is not formed, such that the drain electrode is in direct contact with the crystalline silicon layer and is not in direct contact with the amorphous silicon layer.

8. The method of producing a thin film transistor according to claim 7,
   wherein the step of forming the gate electrode and the step of forming the drain electrode comprise the step of forming an electrode material layer on the gate insulating layer and on the crystalline silicon layer in the region where the gate insulating layer is not formed and the step of patterning the electrode material layer to form the gate electrode and the drain electrode concurrently.

9. A method of producing a thin film transistor, comprising:
forming a gate electrode and a drain electrode in partial regions of a substrate;
forming a gate insulating layer on the substrate and the gate electrode, and on the drain electrode excluding a partial region thereof;
stacking, on the gate insulating layer and on the drain electrode where the gate insulating layer is not formed, a crystalline silicon layer and an amorphous silicon layer sequentially, such that the drain electrode is in direct contact with the crystalline silicon layer and is not in direct contact with the amorphous silicon layer; and
forming a source electrode on the amorphous silicon layer, such that the source electrode is in direct contact with the amorphous silicon layer and is not in direct contact with the crystalline silicon layer.

* * * * *